United States Patent [19]

Sugawara et al.

[11] Patent Number: 5,466,950

[45] Date of Patent: Nov. 14, 1995

[54] SEMICONDUCTOR LIGHT EMITTING DEVICE WITH SHORT WAVELENGTH LIGHT SELECTING MEANS

[75] Inventors: Hideto Sugawara; Kazuhiko Itaya, both of Kanagawa, Japan

[73] Assignee: Kabushiki Kaisha Toshiba, Kanagawa, Japan

[21] Appl. No.: 309,491

[22] Filed: Sep. 22, 1994

[30] Foreign Application Priority Data

Sep. 24, 1993 [JP] Japan ................................. 5-237061

[51] Int. Cl.⁶ ................................................ H01L 33/00
[52] U.S. Cl. ........................... 257/94; 257/96; 257/97; 257/98; 372/46; 372/50; 372/99
[58] Field of Search .......................... 257/13, 85, 94, 257/96, 97, 98; 372/46, 50, 45, 99

[56] References Cited

U.S. PATENT DOCUMENTS

| | | | |
|---|---|---|---|
| 4,993,036 | 2/1991 | Ikeda et al. | 372/50 |
| 5,048,035 | 9/1991 | Sugawara et al. | 372/45 |
| 5,068,868 | 11/1991 | Deppe et al. | 372/46 X |
| 5,086,430 | 2/1992 | Kapon et al. | 372/50 |
| 5,153,889 | 10/1992 | Sugawara et al. | 372/45 |
| 5,324,964 | 6/1994 | Ackley et al. | 257/13 X |

OTHER PUBLICATIONS

"MOVPE Growth and Optical Properties of AlGaInP/GaInP Strained Single Quantum Well Structures", Makoto Kondo et al., *Journal of Crystal Growth* 107 (1991), pp. 578–582.
"Effect of mismatch strain on band gap in III–V semiconductors", Kuo et al., J. Appl. Phys., vol. 57, No. 12, pp. 5428–5432, Jun. 15, 1985.
"Polarized electroluminescence spectra of $Ga_xIn_{1-x}P/(Al_{0.6}Ga_{0.4})_{0.5}In_{0.5}P$ quantum wells", Bour et al., Appl. Phys. Lett., vol. 62, No. 26, pp. 3458–3460, Jun. 28, 1993.

*Primary Examiner*—William Mintel
*Attorney, Agent, or Firm*—Finnegan, Henderson, Farabow, Garrett & Dunner

[57] ABSTRACT

A semiconductor light emitting device. An emitting region has an active layer which emits short wavelength light and long wavelength light caused by inducing some amount of strain. A first reflective layer reflects the short wavelength light to the emitting region, and a second reflective layer reflects the long wavelength light to the emitting region and transmits the short wavelength light. The emitting region is between the first and the second reflective layers. Thereby the short wavelength light is emitted from the second reflective layer.

18 Claims, 4 Drawing Sheets

5,466,950

SEMICONDUCTOR LIGHT EMITTING DEVICE WITH SHORT WAVELENGTH LIGHT SELECTING MEANS

BACKGROUND OF THE INVENTION

Field of the invention

The present invention relates to a semiconductor light emitting device, particularly, to a semiconductor light emitting device having a short wavelength emission.

Description of the related Art

Recently, a light emitting diode (LED) having high emitting efficiency and high luminance is widely researched, for example, for an outdoor display or a traffic signal. However, in a short wavelength region, it is difficult to obtain high efficiency and high luminance. An LED using a new material as an active layer which has a wide band-gap and can be epitaxially grown is researched.

A mixed crystal, InGaAlP is a possible material, because a lattice of InGaAlP can be aligned with a GaAs substrate. The energy gap of InGaAlP is wide and the emission of InGaAlP is a direct transition type. An LED using InGaAlP as an active layer is expected to be an LED for short wavelength emission such as yellow emission or green emission.

The light emitting efficiency of an LED using InGaAlP is not sufficiently high in the short wavelength region. This is because in order to achieve an emission of a short wavelength it is necessary to widen an energy gap. For broadening the energy gap it is necessary to increase the amount of Al in the InGaAlP. However increasing the amount of Al generates a non-radiative center in a semiconductor layer. This is because in growing a semiconductor layer of InGaAlP, Al is chemically reactive and takes oxygen into the layer. This oxygen becomes a non-radiative center.

For example, the emission-efficiency of a yellow LED using InGaAlP ($In_{0.5}(Ga_{0.7}Al_{0.3})_{0.5}P$) is about 1% but the efficiency of a green LED using InGaAlP ($In_{0.5}(Ga_{0.5}Al_{0.5})_{0.5}P$) of which Al content is larger than that of the yellow LED is only about 0.3%.

In order to improve emission-efficiency, a reflective layer is used, such as a Bragg reflective layer. Light is emitted from the front and back surface of an emission region. The light from the back does not contribute on the efficiency. Therefore, the reflective layer is arranged on the back side of the emission region so as to reflect the light emitted from the back surface. Further a current spreading layer or a current blocking layer is used for avoiding emission from under an upper electrode which causes energy loss. These features are discribed in U.S. Pat. No. 5,153,889. However the improvements resulting from these features are not sufficient.

SUMMARY OF THE INVENTION

An object of the present invention is to provide a semiconductor light emitting device which can emit light within a short wavelength region, such as yellow, green or a shorter wavelength color than these.

Another object of the invention is to provide a semiconductor light emitting device which can emit light within a short wavelength region without increasing a content of Al of InGaAlP.

Another object of the invention is to provide a semiconductor light emitting device which can emit light within a short wavelength region with high emitting efficiency.

The present invention provides a semiconductor light emitting device comprising:

an emitting region comprising an active layer which emits short wavelength light and long wavelength light;

a reflective layer formed on the emitting region and having a reflectivity of said long wavelength light larger than that of said short wavelength light so as to reflect said long wavelength light to the emitting region and to transmit said short wavelength light.

The emitting region can be produced by inducing some amount of strain into the active layer. A sufficient amount of tensile strain can split an emission spectrum. Thereby the spectrum has peaks of short wavelength light and lone wavelength light. A wavelength of emitted light from the emitting region through the reflective layer is shorter than that of a no strain induced device.

The reflective layer is one of short wavelength light selecting means permitting the short wavelength light to be emitted and reducing the lone wavelength light coming out. The short wavelength light selecting means includes a reflective means, a color filter, or the like.

The present invention further provides a semiconductor light emitting device comprising:

an emitting region including an active layer of semiconductor material into which tensile strain sufficient to split an emission spectrum is induced; and a first reflective means and a second reflective means arranged to sandwich the emitting region.

A reflectivity of the first reflective means for the short wavelength light is larger than that for the lone wavelength light, and a reflectivity of the second reflective means for said long wavelength light is larger than that for the short wavelength light. Thereby the intensity of the short wavelength light is selectively strengthened and emitted through the second reflective means.

The present invention also provides a semiconductor light emitting device comprising:

a substrate of a first conductive type semiconductor;

a first reflective layer of said first conductive type semiconductor formed on said substrate;

an emitting region comprising an active layer composed of a semiconductor into which enough tensile strain to split an emission spectrum is induced;

a second reflective layer of a second conductive type semiconductor formed over said emitting region;

a first electrode for supplying a carrier of said second conductive type to said emitting region; and a second electrode for supplying a carrier of said first conductive type to said emitting region;

wherein said emission spectrum has peaks of short wavelength light and long wavelength light, a reflectivity of said first reflective layer for said short wavelength light is larger than that for said lone wavelength light, and a reflectivity of said second reflective layer for said lone wavelength light is larger than that for said short wavelength light.

The present invention further provides a semiconductor light emitting device comprising:

a substrate of n-type GaAs:

a buffer layer of n-type GaAs semiconductor on said substrate;

a first reflective layer of n-type semiconductor formed on said buffer layer;

a first clad layer of n-type InAlP semiconductor formed on said first reflective layer:

an active layer of undoped InGaAlP semiconductor formed on said first clad layer, into which tensile strain enough to split an emission spectrum of said active layer is induced;

a second clad layer of p-type InAlP semiconductor formed on said active layer;

a current blocking layer of n-type semiconductor formed in a central portion on said second clad layer;

a first current spreading layer of p-type GaAlAs semiconductor formed on said second clad layer and said current blocking layer;

a second reflective layer of p-type semiconductor formed on said first current spreading layer;

a second current spreading layer of p-type GaAlAs semiconductor formed on said second reflective layer;

a contact layer of p-type GaAs semiconductor formed on said second current spreading layer above said current blocking layer;

a first electrode formed on said contact layer; and a second electrode formed on said substrate, wherein said emission spectrum has peaks of short wavelength light and long wavelength light, a reflectivity of said first reflective layer for said short wavelength light is larger than that for said long wavelength light, and a reflectivity of said second reflective layer for said long wavelength light is larger than that for said short wavelength light.

The present invention also provides a method for shortening a wavelength of emitted light from a semiconductor light emitting device comprising an emitting region including an active layer of semiconductor material, comprising steps of:

inducing tensile sufficient strain into said active layer to split an emission spectrum of said active layer, so that the spectrum has two peaks of short wavelength light and long wavelength light; and transmitting light emitted from the emitting region through a short wavelength light selecting means to reduce the intensity of the long wavelength light and to permit the short wavelength light to be emitted.

The present invention also provides a semiconductor light emitting device comprising:

an emitting region including an active layer of semiconductor material into which tensile strain sufficient to split an emission spectrum is induced, so that the spectrum has peaks of short wavelength light and long wavelength light; and a first reflective means and a second reflective means arranged to sandwich said emitting region, wherein a reflectivity of said first reflective means for said short wavelength light is larger than that for said long wavelength light, and a reflectivity of said second reflective means for said long wavelength light is larger than that for said short wavelength light, thereby the intensity of said short wavelength light selectively strengthened and emitted through said second reflective means.

The present invention also provides a semiconductor light emitting device comprising:

a substrate of single crystalline material having a lattice constant of $a_0$;

an emitting region formed on the substrate, comprising an active layer of semiconductor material which has a lattice constant of $a_a$ satisfying the relation of $(a_a-a_0)/a_0 < -0.01$ corresponding to an emission spectrum having two peaks of short wavelength light and long wavelength light; and a first and a second reflective layer respectively disposed on opposite sides of said emitting region, wherein a reflectivity of said first reflective layer for said short wavelength light is larger than that for said lone wavelength light, and a reflectivity of said second reflective layer for said long wavelength light is larger than that for said short wavelength light, thereby said short wavelength light is emitted through said second reflective layer.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

It is known that some amount of tensile strain induced into an active layer composed of a compound semiconductor, such as a III–V compound, causes a peak of a photo-luminescence spectrum to shift to a short wavelength side such as disclosed in C. P. Kuo, et al., J. Appl. Phys. 57(12),15 Jun. 1985, p. 5428, or D. P. Bour, et al., Appl. Phys. Lett. 62(26),28 Jun. 1993, p. 3458.

It is also known that some amount of tensile strain induced into an active layer having $(Al_{0.7}Ga_{0.3})_{0.5}In_{0.5}P/Ga_xIn_{1-x}P$ strained single quantum well structures causes a peak of a photo-luminescence spectrum to split such as disclosed in M. Kondo, et al., J. Crystal Growth 107 (1991) p. 578.

The present inventors considered that the phenomenon of splitting a peak of a spectrum can be used to shorten an emission wavelength of a semiconductor light emitting device. They invented a device comprising a short wavelength light selecting means permitting the short wavelength light to be emitted and reducing the intensity of the long wavelength light.

Figure 1:
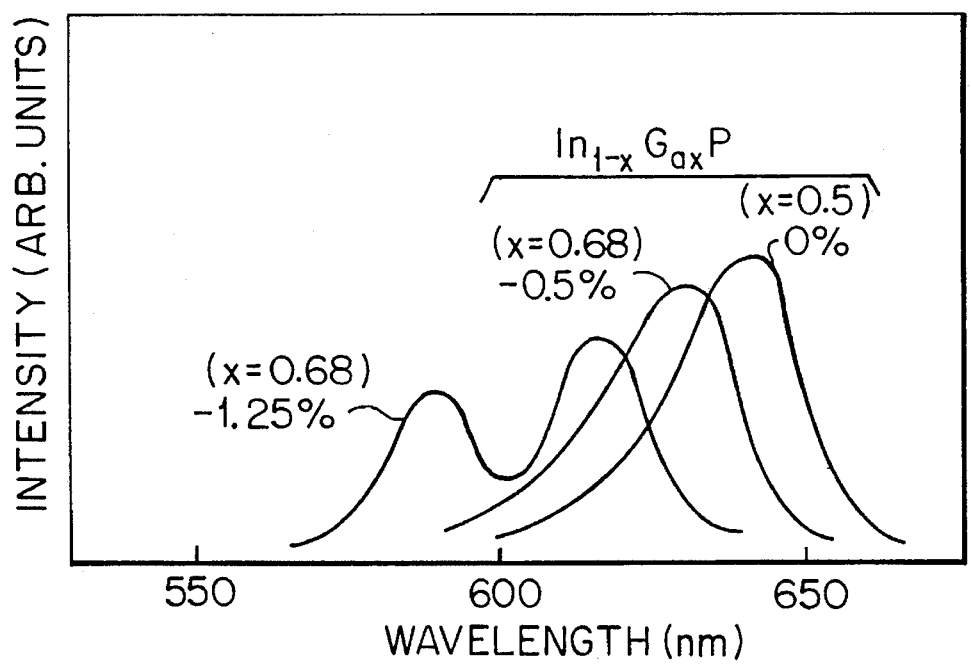
FIG. 1 is a graph showing an emission spectrum of $In_{1-x}Ga_xP$ using a substrate of GaAs.

FIG. 1 shows the relationship between the amount of Ga in an active layer $In_{1-x}Ga_xP$ using a substrate of GaAs and an emission spectrum. When x=0.5, the value of strain in the active layer is zero and there is only one peak of about 640 nm in the emission spectrum. Increasing the amount of Ga, the value of tensile strain increases and the peak of the emission spectrum shifts to a short wavelength side. However the amount of shift is small until splitting the peak occurs. For example, when x=0.58, the amount of tensile strain is about −0.5% and the peak of the spectrum is at about 630 nm. When x=0.68, the amount of tensile strain is about −1.25% and the peak of the spectrum splits. There are two peaks of about 590 nm and about 620 nm. The amount of the shift from 640 nm (x=0.5) to 590 nm (x=0.68) is very large.

In the present specification, an amount of strain is represented by the following formula:

$$[(a_a-a_0)/a_0]*100 \ (\%)$$

$a_a$: a lattice constant of an active layer with no strain $a_0$: a lattice constant of a substrate When tensile strain is induced, the amount of strain is negative. It is a calculated value, i.e. a planned value. It is considered that, because of the negative strain, transformation may occur in a thickness direction and an amount of transformation may be about twice the value of the amount of strain.

Figure 2:
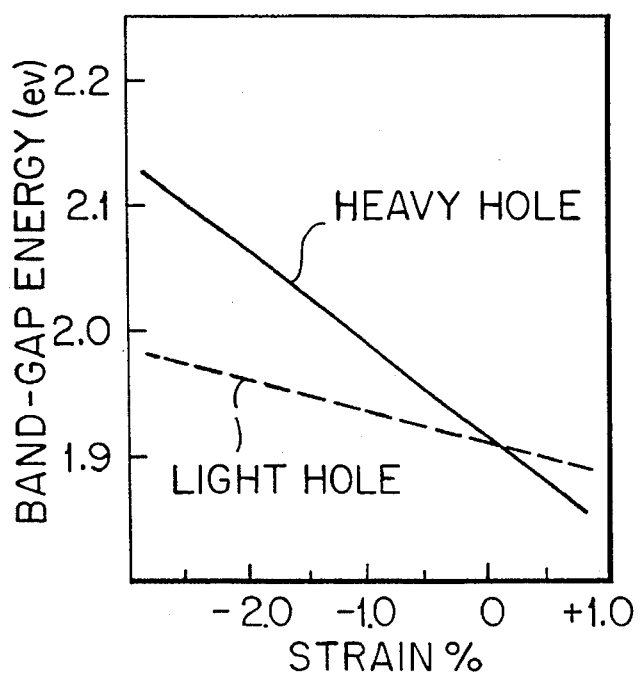
FIG. 2 is a graph showing a band-gap energy of $In_{1-x}Ga_xP$ using a substrate of GaAs.

The splitting phenomenon may be caused by band splitting. FIG. 2 shows the relation between the amount of strain in $In_{1-x}Ga_xP$ and band-gap energy. Increasing the amount of tensile strain causes valence band splits to a band of a heavy hole which has a large effective mass and that of a light hole which has a small effective mass. The band-gap energy between the valence band of the heavy hole and a conduction band becomes large. The recombination between the band of the heavy hole and the conduction band may contribute to short wavelength emission.

The 590 nm emission (yellow light) which is the emission between the heavy-hole valence band and the conduction band of $In_{1-x}Ga_xP$ (x=0.68), is equal to that of $In_{0.5}(Ga_{1-x}Al_x)_{0.5}P$ (x=0.3) with no strain. By inducing some amount of strain into an active layer, it is possible to emit short wavelength light without increasing the amount of Al. As a result, the intensity of the light increases.

In accordance with the present invention, a semiconductor light emission device comprises an emitting region having an active layer composed of a semiconductor with a sufficient tensile strain to split an emission spectrum so that the spectrum has peaks of short wavelength light and long wavelength light.

This phenomenon can occur using a semiconductor material as an active layer having a valence-band degeneracy which can be split by strain. For example, III–V compounds and II–VI compounds can be used, such as $In_{1-x}Ga_xAs$ [0<x<1], $In_{1-x}Ga_xP$ [0<x<1], $In_{1-y}(Ga_{1-x}Al_x)_yP$ [0≦x≦1, 0<y<1], $ZnS_{1-x}Se_x$ [0<x< 1]. In this specification, a compound which comprises at least three elements is represented without the ratio, such as InGaAlP, InGaAs, InGaP, GaAlAs, InGaAsP or ZnSSe.

The strain can be induced by epitaxial growth on a single crystal substrate having a different lattice constant from the active layer, such as GaAs or InP.

The active layer necessarily has enough thickness to recombine carriers. Generally the thickness is about 100 to about 600 nm. However the active layer is necessarily thin to enable inducing a sufficient strain, such as about 1% or more (absolute value), and preferably larger than about 1.25% (absolute value). In practice, the upper limit of the strain may be about −1.5%. A semiconductor layer with excess strain can not be epitaxially grown, so the thickness is preferably about between 10 and about 30 nm. Generally the emitting region has a clad layer on the active layer which has a wider band-gap energy than that of the active layer, because carriers are effectively injected into the active layer. The structure that an active layer is put between a p-type clad layer and an n-type clad layer is called a double hetero structure. This double hetero structure can confine carriers of electrons and holes in the active layer effectively.

In the present invention, an active layer or clad layer can be comprised of III–V or II–VI compound. A super-lattice structure or multi quantum well structure(MQW) can be used. The light emitting device of the present invention can also be constructed without the clad layers, although confinement of carriers to the active layer will be less effective.

In the present invention, a semiconductor light emitting device further comprises a short wavelength light selecting means. This means permits the short wavelength light to be emitted and reduces the intensity of the long wavelength light.

For example, the selecting means comprises a filter such as a color filter composed of resin. The resin may be molded-resin for the device.

Another selecting means comprises a first reflective means and a second reflective means arranged to sandwich the emitting region. A reflectivity of the first reflective means for the short wavelength light is larger than that for the long wavelength light, and a reflectivity of the second reflective means for the long wavelength light is larger than that for the short wavelength light. Thereby the short wavelength light is selectively emitted from the side of the second reflective means.

For example, the first and second reflective means can each comprise a multi-layer semiconductor structure, i.e., Bragg reflector. A Bragg reflector comprises semiconductor layers having different refractive indexes. A Bragg reflector can selectively reflect light having a wavelength within a predetermined range of wavelengths. This range can be controlled by the refractive index and thickness of each semiconductor layer. It is represented by the following formula:

$$d=\lambda/4n$$

d: a thickness of each semiconductor layer $\lambda$: a wavelength of the peak of the reflectivity n: a refractive index of each layer For example, the combination of $In_{1-y}(Ga_{1-x}Al_x)_yP$ [0≦x, y≦1] and $Ga_{1-x}Al_xAs$ [0≦x≦1], the combination of $(In_{1-x}Ga_x)(As_{1-y}P_y)$ [0≦ x,y≦1] and II–VI compound such as ZnSSe, and super-lattice material, can be used.

The selecting means can select the short wavelength light caused by strain, so that pure color for the short wavelength light is obtained. The peak wavelength can be predetermined by the amount of strain, or easily known by an experiment using photo-luminescense. As a result, the reflectivity can be predetermined suitably.

Furthermore, when the first and second reflective means are used, the intensity of the short wavelength light increases. The intensity of the short wavelength light can be increased by only using the first reflective means arranged at an opposite side from the light emitting side, i.e., a substrate side. However the second reflective means, which is arranged near a surface of the device, i.e., near the light emitting side, can increase the intensity of the short wavelength light more than achieved in the case of only providing the first reflective means. The inventors believe that the long wavelength light reflected by the second reflective means on a light emitting side is absorbed in the active layer and the energy of the long wavelength light may be used to excite carriers, so that the intensity of the short wavelength light increases. In this regard, it is believed that some kind of photon recycling which generates short wavelength light is caused by the long wavelength light. In other words, the energy of the long wavelength light is smaller than that of the short wavelength light, so the long wavelength light is not effective for the short wavelength light emission. However, it may be considered that the short wavelength light emission is caused by the long wavelength light.

According to the present invention, in using InGaAlP as an active layer, short wavelength light can be obtained without increasing an amount of Al in an active layer. In this case, a number of non-radiative recombination centers is reduced and the emission-efficiency is increased.

The present invention is effective for a short wavelength region, such as shorter than 600 nm, preferably shorter than 590 nm, because it is difficult to obtain high efficiency without strain.

Embodiments of the present invention are described next with reference to the accompanying drawing.

Figure 3:
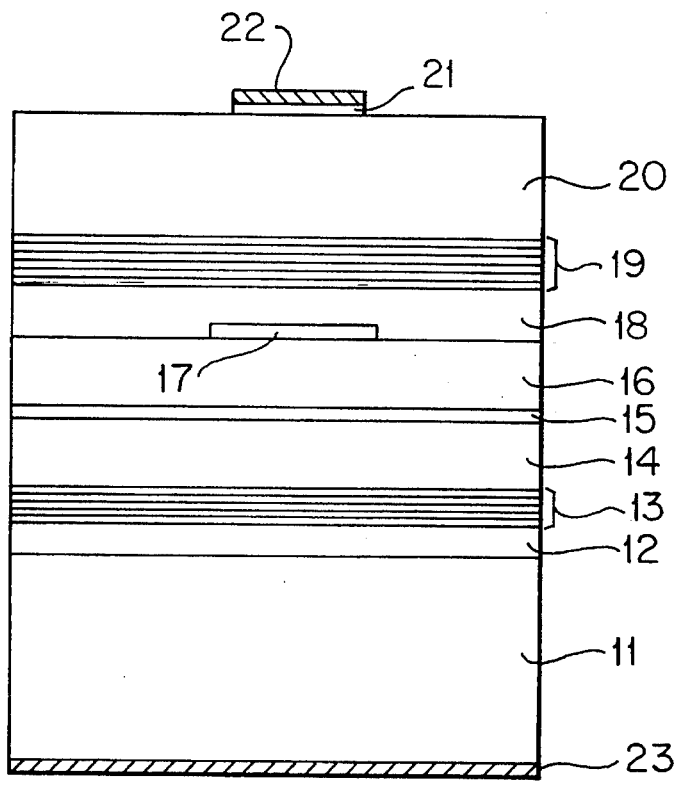
FIG. 3 is a cross-sectional view showing the construction of a semiconductor light emitting device according to a first embodiment of the present invention.

FIG. 3 is a cross-sectional view showing the construction of a semiconductor light emission device according to a first embodiment of the present invention.

A substrate 11 consists of n-type GaAs single crystal doped with Si at $5*10^{18}$ cm$^{-3}$. The plane direction of the substrate 11 is inclined from (100) plane by 15° to [011] direction. Generally the substrate of which the plane direction is (100) or inclined by 25° or less, i.e., an off angle substrate, is preferred for obtaining good emission efficiency or shortening a wavelength of an emission light. Generally an electrode is formed on the substrate, so that the concentration of the dopant is preferably larger than about $3*10^{18}$ cm$^{-3}$.

A buffer layer 12 which consists of n-type GaAs doped with Si at $5*10^{18}$ cm$^{-3}$, is formed on the substrate 11. The thickness of the buffer layer 12 is about 0.5 µm. The buffer layer 12 is formed to make a flat surface having very few defects and its thickness is generally between about 0.01 and about 1.0 µm. The concentration of the dopant is substantially the same as that of the substrate. If the surface of the substrate 11 has very few defects, then the buffer layer 12 is not required.

A first reflective layer 13 is formed on the buffer layer 12. The peak of the reflectivity of the first reflective layer 13 is set at about 550 nm. It is possible to alternately laminate the first reflective layer 13 to consist of n-In$_{0.5}$Al$_{0.5}$P layers (refractive index n=4.05, thickness d=33.95 nm) doped with Si at $5*10^{17}$ cm$^{-3}$ and Si-doped n-GaAs layers (n=3.97, d=34.63 nm) doped with Si at $5*10^{17}$ cm$^{-3}$ so as to form the reflective layer 13. A sufficient number of each type of layer is ten, to result in a total of twenty layers forming reflective layer 13. The reflective performance may saturate if more than ten layers of each type are used.

A first clad layer 14 which consists of n-In$_{0.5}$Al$_{0.5}$P doped with Si at $5*10^{17}$ cm$^{-3}$, is formed on the first reflective layer 13. An active layer 15 which consists of undoped In$_{0.35}$(Ga$_{0.9}$Al$_{0.1}$)$_{0.65}$P, is formed on the first clad layer 14. A second clad layer 16 which consists of p-In$_{0.5}$Al$_{0.5}$P doped with Zn at $5*10^{17}$ cm$^{-3}$ is formed on the active layer 15. The band-gap energy of the first and second clad layers is larger than that of the active layer. An emitting region consists of these three layers 14, 15 and 18 which compose a double hetero structure.

The concentration of a dopant in the n-type clad layer 14 is preferably between about $2*10^{17}$ cm$^{-3}$ to about $1*10^{18}$ cm$^{-3}$. The concentration of a dopant in the p-type clad layer 18 is preferably about $5*10^{17}$ cm$^{-3}$ to about $1*10^{18}$ cm$^{-3}$.

In this embodiment, the thickness of the active layer 15 is about 12 nm. The thickness of the first clad layer 14 is about 1 µm and is preferably between about 0.5 and about 1.0 µm. The thickness of the second clad layer 16 is about 1 µm and is preferably between about 0.5 to about 1.5 µm. When the thickness of the first clad layer 14 is m*λ/2[λ:a wavelength of a short wavelength light, m:an integral number], the intensity of the short wavelength light can be increased.

A current blocking layer 17, which consists of n-In$_{0.5}$(Ga$_{0.3}$Al$_{0.7}$)$_{0.5}$ P doped with Si at $1*10^{18}$ cm$^{-3}$ is formed on the central portion of the second clad layer 16. The thickness of the current blocking layer 17 is about 50 nm.

The current blocking layer 17 is not always needed, however it is effective to improve emission-efficiency. The emission light from the central portion of the emitting region can not be emitted from the device because the light is reflected by an upper electrode that is a first electrode 22 described below. As a result, the emission from the central portion of the emitting region is useless and represents a loss of energy. The current blocking layer cuts off current to be injected into the central portion of the emission region, thereby improving the emission-efficiency.

However some amount of emission may occur in the central portion of the emitting region under the current blocking layer, because carriers may be supplied to the central portion from a side portion adjacent the central portion. Therefore, for using the light from the central portion of the emitting region, the current blocking layer is preferably transparent to emitted light.

For current blocking, the current blocking layer may consist of a semiconductor material of an opposite conductivity type relative to the second clad layer, or an insulator. When the current blocking layer consists of semiconductor material, a reverse bias is applied between the current blocking layer and the second cladding layer. In order to avoid break down under application of the reverse bias, the doping concentration of the current blocking layer is preferably larger than $10^{18}$ cm$^{-3}$. The thickness of the current blocking layer is preferably about 20 to about 150 nm. There is a step between the edge of the current blocking layer and the surface of the second clad layer 16. An excess thickness of the current blocking layer may cause difficulty in depositing the next layer on the current blocking layer and the second clad layer.

A first current spreading layer 18 which consists of p-(Ga$_{0.2}$Al$_{0.8}$)As doped with Zn at $2*10^{18}$ cm$^{-3}$, is formed on the second clad layer 16 and the current blocking layer 17. The thickness of the current spreading layer 18 is about 1 µm.

The first current spreading layer 18 is not always needed, however it is effective to obtain a flat surface when the current blocking layer 17 is formed. The thickness of the current spreading layer 18 is preferably about 0.5 to about 2 µm. The current spreading layer is transparent to emitted light.

A second reflective layer 19 is formed on the current spreading layer 18. The peak of the reflectivity of the second reflective layer 13 is set at about 600 nm. It is possible to alternately laminate the second reflective layer 19 to consist of p-AlAs layers (refractive index n=3.10, thickness d=48.39 nm) doped with Zn at $1*10^{18}$ cm$^{-3}$ and p-(Ga$_{0.6}$Al$_{0.4}$)As layers (n=3.67, d=40.87 nm) doped with Zn at $1*10^{18}$ cm$^{-3}$ so as to form the reflective layer 19. The number of each type of layer is thirty, to result in a total of sixty layers forming the reflective layer 19. The reflective performance may saturate if more than thirty layers of each type is used.

A second current spreading layer 20 which consists of p-$(Ga_{0.2}Al_{0.8})$As doped with Zn at $2*10^{18}$ cm$^{-3}$, is formed on the second reflective layer 19. The thickness of the current spreading layer 20 is about 7 μm.

The second current spreading layer 20 is effective to spread current from an electrode only formed on the central portion of the current spreading layer. The thickness of the current spreading layer 20 is preferably about 3 μm to about 15 μm. The current spreading layer 20 is transparent to emitted light, especially short wavelength light. For effective current spreading, high conductivity which is higher than the emitting region or the second reflective layer, is needed. Therefore, the doping concentration of the layer 20 is preferably larger than about $2*10^{18}$ cm$^{-3}$.

A contact layer 21 which consists of p-GaAs doped with Zn at $5*10^{18}$ cm$^{-3}$, is formed on the second current spreading layer 20. A first electrode 22, which can consist of AuZn alloy, is formed on the contact layer 21. The contact layer 21 is useful to make ohmic contact. If an ohmic contact can be made without a contact layer, the contact layer is not needed. For example, there is a method known for forming an ohmic contact by alloying metal of an electrode with a semiconductor.

A second electrode 23, which may consist of AuGe alloy, is formed on the opposite side of the substrate 11. The second electrode 23 and the substrate 11 make ohmic contact.

These layers are epitaxially grown on the substrate 11 by a process such as MOCVD(metal organic chemical vapor deposition), MBE(molecular beam epitaxy) or MEE(migration enhanced epitaxy). The current blocking layer 18 and the contact layer 21 can be made with etching processes. There is substantially not strain in these layers except for the active layer 15, because there is not substaintially a difference between each layer and the substrate in the lattice constant. The difference between the current spreading layer 18,20 and the substrate is about 0.2% and that of the others is less than ±0.1%.

Figure 4:
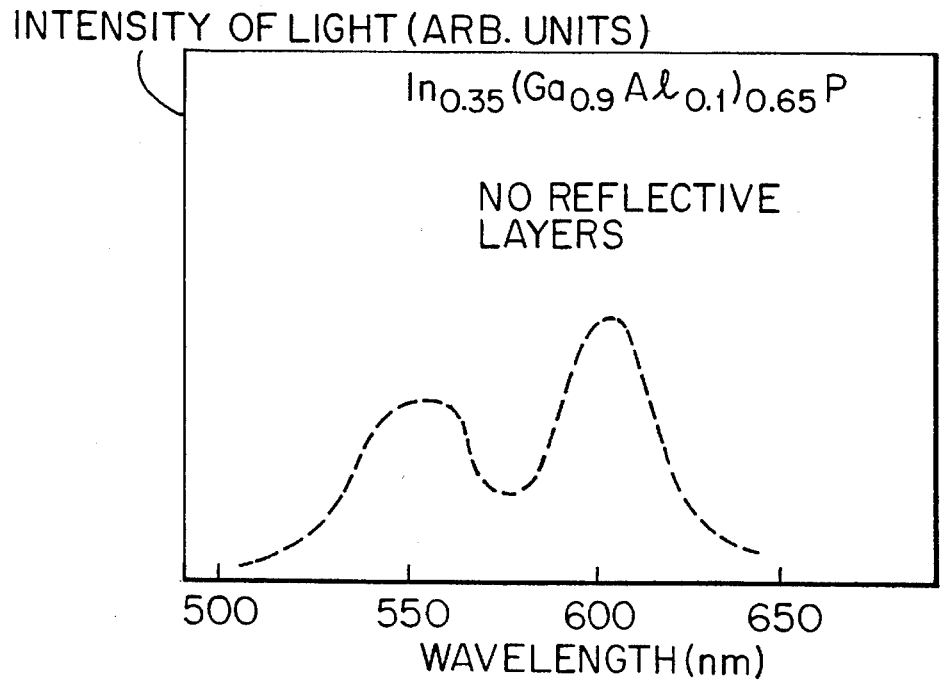
FIG. 4 is a graph showing the emission spectrum of the first embodiment without reflective layers.

In this embodiment, the value of tensile strain in the active layer 15 is about −1.25%. It is enough to split the peak of the emission spectrum of the active layer. For showing the effect of strain, an emission spectrum without the first and the second reflective layers is showed in FIG. 4. The spectrum has two peaks at about 550 nm and about 800 nm. This is the effect of the tensile strain.

Figure 5:
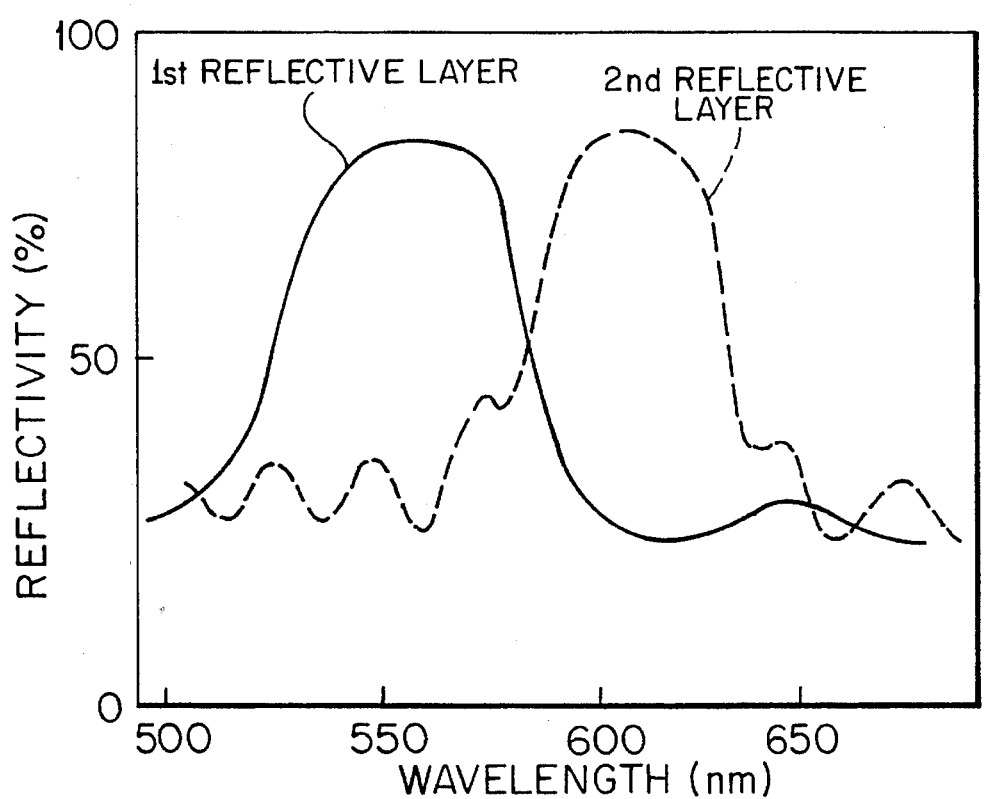
FIG. 5 is a graph showing the reflectivity of the first and second reflective layers of the first embodiment.

FIG. 5 shows the reflectivity of the first and the second reflective layers of this embodiment. The first reflective layer 13 at the substrate side of the active layer can transmit the light of 600 nm but reflects the light of 550 nm. The second reflective layer 19 on the surface side of the active layer can transmit the light of 550 nm but reflects the light of 600 nm. The light of 600 nm emitted from the active layer 15 is reflected by the second reflective layer 19 so that the light returns to the active layer 15. The light of 550 nm emitted from the active layer 15 to the substrate side is reflected by the first reflective layer to the active layer 15 and the surface side.

Figure 6:
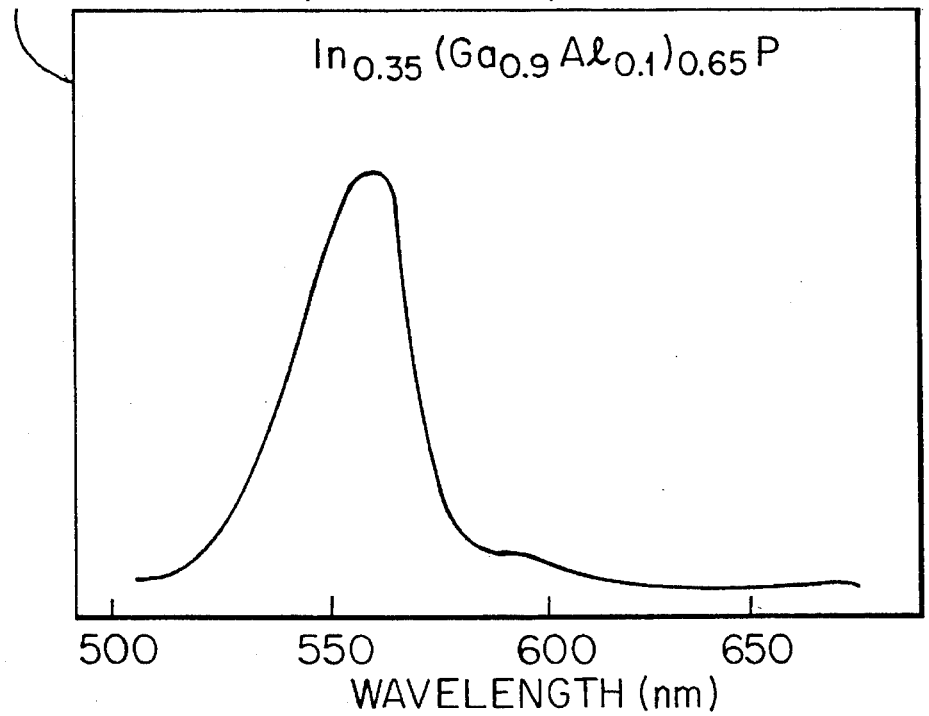
FIG. 6 is a graph showing the emission spectrum of the first embodiment.

FIG. 6 shows the emission spectrum of this embodiment. The first and second reflective layers cause the intensity of light at 550 nm to increase and the intensity of the light at 600 nm to decrease.

When only the first reflective layer is provided, the intensity of light at 550 nm is about 2.5 times as large as the intensity of light without the first and second reflective layer. However when the first and the second reflective layers are provided, the intensity becomes about five times as large as the intensity without the first and the second reflective layers. This improvement is believed to be caused by the above-mentioned photon recycle. It is also believed that an increase in the intensity of 550 nm light can be achieved by providing only the second reflective layer.

When a bias current is 20 mA, the intensity of light at 550 nm is 2 cd without the first and the second reflective layers. The intensity becomes 5 cd with only the first reflective layer and 10 cd with the first and second reflective layers.

A device having an active layer of $In_{0.5}(Ga_{0.55}Al_{0.45})_{0.5}P$ without strain can emit green light of 550 nm, but the intensity is only about 2 cd.

Therefore, it is established that the strain induced to the active layer is effective for increasing the intensity of short wavelength emission, and furthermore, the second reflective layer is very effective for increasing the intensity of shorter wavelength light of a split spectrum.

In the first embodiment, the efficiency of emission may change with the thickness of the first clad layer 14. The thickness is preferably about m*λ/2 [m:integral number, λ:wavelength]. And λ is preferably the wavelength of the shorter wavelength side peak of the split spectrum so that the selectiveness of the shorter wavelength light is improved.

Figure 7:
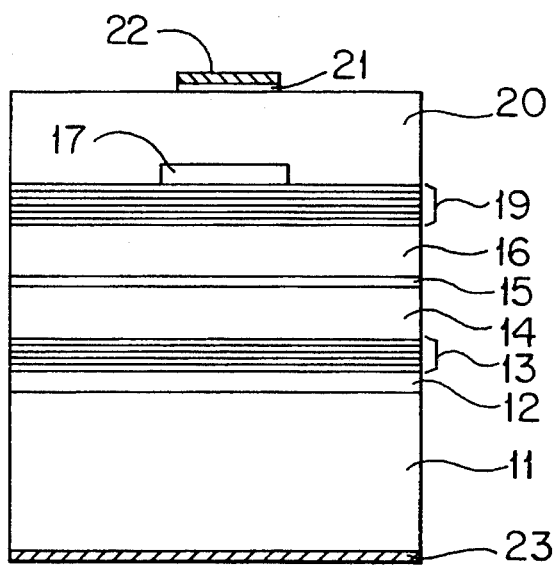
FIG. 7 is a cross-sectional view showing the construction of a semiconductor light emitting device according to a second embodiment of the present invention.

FIG. 7 is a cross-sectional view showing the construction of a semiconductor light emission device according to a second embodiment of the present invention.

In the first embodiment, the current blocking layer 17 is not required at the position shown in FIG. 3. In the second embodiment, the position of the current blocking layer 17 is changed to be on the second reflective layer 19. The first current spreading layer 18 is formed to have a flat surface in the first embodiment. As the current blocking layer 17 is moved on to the second reflective layer, the first current spreading layer 18 becomes unnecessary, so the first current spreading layer 18 is not provided in the second embodiment. The description of the remaining layers is the same as the first embodiment and is omitted.

Figure 8:
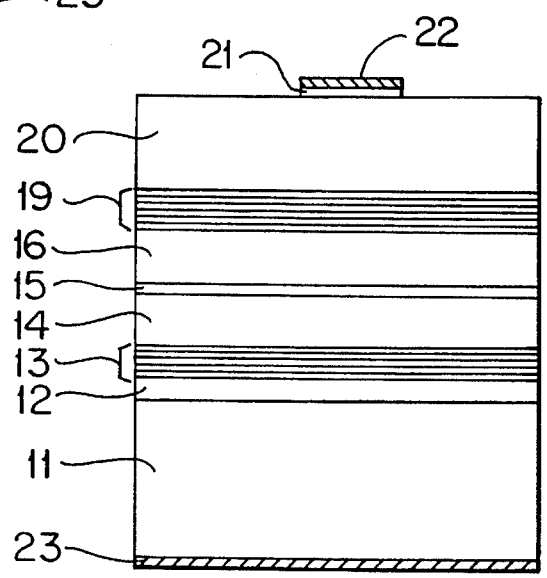
FIG. 8 is across-sectional view showing the construction of a semiconductor light emitting device according to a third embodiment of the present invention.

FIG. 8 is a cross-sectional view showing the construction of a semiconductor light emission device according to a third embodiment of the present invention.

In the first embodiment, the current blocking layer 17 is not required. The third embodiment does not have the current blocking layer 17. The description of the remainder of the third embodiment is otherwise the same as the first embodiment.

Figure 9:
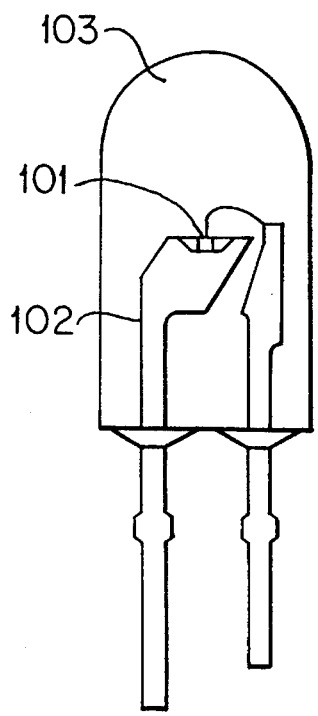
FIG. 9 is a cross-sectional view showing the construction of a semiconductor light emitting device according to a fourth embodiment of the present invention.

In the first embodiment, the first and second reflective layers are used as the short wavelength light selecting means. However, a molded resin can also be used. FIG. 9 is a cross sectional view showing the construction of a semiconductor light emission device according to the fourth embodiment of the present invention.

In this embodiment, a semiconductor chip 101 comprises an active layer with strain mounted on a lead 102 and molded by a colored resin 103, for example epoxy resin and the like, which permits the short wavelength light to come out and cuts off the long wavelength light.

Obviously, numerous modifications and variations of the present invention are possible in light of the above teachings, It is therefore to be understood that within the scope of the appended claims, the invention may be practiced otherwise than as specifically described herein.

What is claimed is:

1. A semiconductor light emitting device, comprising:

a substrate of n-type GaAs;

a buffer layer of n-type GaAs semiconductor on said substrate;

a first reflective layer of n-type semiconductor on said buffer layer;

a first clad layer of n-type InAlP semiconductor on said first reflective layer;

an active layer of undoped InGaAlP semiconductor on said first clad layer, into which enough tensile strain to split an emission spectrum of said active layer is induced;

a second clad layer of p-type InAlP semiconductor on said active layer;

a current blocking layer of n-type semiconductor on a central portion on said second clad layer;

a first current spreading layer of p-type GaAlAs semiconductor on said second clad layer and said current blocking layer;

a second reflective layer comprising a p-type semiconductor on said first current spreading layer;

a second current spreading layer of p-type GaAlAs semiconductor on said second reflective layer;

a contact layer of p-type GaAs semiconductor on said second current spreading layer above said current blocking layer;

a first electrode formed on said contact layer; and a second electrode on said substrate, wherein said emission spectrum has peaks of short wavelength light and long wavelength light, a reflectivity of said first reflective layer for said short wavelength light is larger than that for said long wavelength light, and a reflectivity of said second reflective layer for said long wavelength light is larger than that for said short wavelength light.

2. A semiconductor light emitting device according to the claim 1, wherein a lattice constant $a_a$ of said active layer satisfies the relation of $(a_a - a_0)/a_0 \leq -0.01$.

3. A semiconductor light emitting device, comprising:

a substrate of a first conductive type semiconductor;

a first reflective layer of said first conductive type semiconductor on said substrate;

an emitting region comprising an active layer of semiconductor into which enough tensile strain to split an emission spectrum is induced;

a second reflective layer of a second conductive type semiconductor, said emitting region being between said first and second reflective layers;

a first electrode for supplying a carrier of said second conductive type to said emitting region; and a second electrode for supplying a carrier of said first conductive type to said emitting region, wherein said emission spectrum has peaks of short wavelength light and long wavelength light, a reflectivity of said first reflective layer for said short wavelength light is larger than that for said long wavelength light, and a reflectivity of said second reflective layer for said long wavelength light is larger than that for said short wavelength light.

4. A semiconductor light emitting device according to the claim 3, wherein said first reflective layer and said second reflective layer are aligned with said substrate, and a lattice constant $a_a$ of said active layer satisfies the relation of $(a_a - a_0)/a_0 \leq -0.01$.

5. A semiconductor light emitting device according to the claim 3, further comprising a current spreading layer having higher electrical conductivity than that of said emitting region on said second reflective layer, wherein said first electrode is on said current spreading layer.

6. A semiconductor light emitting device according to claim 3, wherein the wavelength of said short wavelength light is shorter than about 600 nm.

7. A semiconductor light emitting device, comprising:

an emitting region including an active layer of semiconductor material into which tensile strain sufficient to split an emission spectrum is induced, so that the spectrum has peaks of short wavelength light and long wavelength light: and a first reflective means and a second reflective means arranged to sandwich said emitting region, wherein a reflectivity of said first reflective means for said short wavelength light is larger than that for said long wavelength light, and a reflectivity of said second reflective means for said long wavelength light is larger than that for said short wavelength light, thereby the intensity of said short wavelength light is selectively strengthened and emitted through said second reflective means.

8. A semiconductor light emitting device, comprising:

an emitting region comprising an active layer of semiconductor material into which tensile strain sufficient to split an emission spectrum is induced, so that the spectrum has peaks of short wavelength light and long wavelength light; and a short wavelength light selecting means to permit the short wavelength light to be emitted from the device and the intensity of the long wavelength light to be reduced.

9. A semiconductor light emitting device according to the claim 8, wherein the short wavelength light selecting means comprises a reflective layer which is more transmissive to the short wavelength light than to the long wavelength light.

10. A semiconductor light emitting device according to the claim 8, wherein the short wavelength light selecting means comprises a colored molded resin.

11. A method for shortening a wavelength of emitted light from a semiconductor light emitting device comprising an emitting region including an active layer of semiconductor material, comprising the steps of:

inducing tensile sufficient strain into said active layer sufficient to split an emission spectrum of said active layer, so that the spectrum has two peaks of short wavelength light and long wavelength light: and transmitting light emitted from the emitting region through a short wavelength light selecting means to reduce the intensity of the long wavelength light and to permit the short wavelength light to be emitted.

12. A semiconductor light emitting device, comprising:

an emitting region comprising an active layer which emits short wavelength light and long wavelength light;

a reflective layer on the emitting region and having a reflectivity of said long wavelength light larger than that of said short wavelength light so as to reflect said long wavelength light to the emitting region and to transmit said short wavelength light.

13. A semiconductor light emitting device, comprising:

an emitting region including an active layer which emits short wavelength light and long wavelength light;

a first reflective layer having a reflectivity for the short wavelength light that is larger than that for the long wavelength light; and a second reflective layer having a reflectivity for the long wavelength light that is larger than that for the short wavelength light, wherein the emitting region is disposed between the first and second reflective layers, so that the short wavelength light is emitted through the second reflection layer.

14. A semiconductor light emitting device according to the claim 13, wherein tensile strain is induced into the active layer.

15. A semiconductor light emitting device, comprising:
   a substrate of single crystalline material having a lattice constant of $a_0$;
   an emitting region on the substrate, comprising an active layer of semiconductor material which has a lattice constant of $a_a$ satisfying the relation of $(a_a-a_0)/a_0 \leq -0.01$ corresponding to an emission spectrum having two peaks of short wavelength light and long wavelength light; and
   a first reflective layer and a second reflective layer respectively disposed on opposite sides of said emitting region,
   wherein a reflectivity of said first reflective layer for said short wavelength light is larger than that for said lone wavelength light, and a reflectivity of said second reflective layer for said long wavelength light is larger than that for said short wavelength light, thereby said short wavelength light is emitted through said second reflective layer.

16. A semiconductor light emitting device according to the claim 15, wherein said first reflective layer is between said substrate and said emitting region.

17. A semiconductor light emitting device according to the claim 15, wherein said second reflective layer is on said emitting region.

18. A semiconductor light emitting device according to the claim 15, further comprising a current spreading layer having higher electrical conductance than that of said emitting region and on said second reflective layer, a first electrode on a central portion of said current spreading layer, and a second electrode on said substrate.

* * * * *

UNITED STATES PATENT AND TRADEMARK OFFICE
CERTIFICATE OF CORRECTION

PATENT NO. : 5,466,950
DATED : November 14, 1995
INVENTOR(S) : Hideto SUGAWARA et al It is certified that error appears in the above-indentified patent and that said Letters Patent is hereby corrected as shown below:

Claim 4, Column 11, line 60, after "0.01", insert --[$a_o$ : a lattice constant of said substrate]

Claim 15, Column 13, line 11, "spactrum" should read --spectrum--;

Claim 15, Column 13, line 18, "lone" should read --long--

Signed and Sealed this

Eighth Day of October, 1996

BRUCE LEHMAN

Attest:

Attesting Officer

Commissioner of Patents and Trademarks